(12) United States Patent
Amiri et al.

(10) Patent No.: US 12,394,463 B2
(45) Date of Patent: Aug. 19, 2025

(54) STOCHASTIC MEMRISTIVE DEVICES BASED ON ARRAYS OF MAGNETIC TUNNEL JUNCTIONS

(71) Applicant: NORTHWESTERN UNIVERSITY, Evanston, IL (US)

(72) Inventors: Pedram Khalili Amiri, Wilmette, IL (US); Giovanni Finocchio, Messina (IT)

(73) Assignee: NORTHWESTERN UNIVERSITY, Evanston, IL (US)

( * ) Notice: Subject to any disclaimer, the term of this patent is extended or adjusted under 35 U.S.C. 154(b) by 169 days.

(21) Appl. No.: 18/531,588

(22) Filed: Dec. 6, 2023

(65) Prior Publication Data

US 2024/0105245 A1  Mar. 28, 2024

Related U.S. Application Data

(60) Division of application No. 17/406,491, filed on Aug. 19, 2021, now Pat. No. 11,875,833, which is a continuation-in-part of application No. 16/919,997, filed on Jul. 2, 2020, now Pat. No. 11,127,446.

(60) Provisional application No. 62/870,277, filed on Jul. 3, 2019.

(51) Int. Cl.
*G11C 11/16* (2006.01)
*G06N 3/04* (2023.01)
*G11C 11/54* (2006.01)
*H10B 61/00* (2023.01)
*H10N 50/80* (2023.01)

(52) U.S. Cl.
CPC ............ *G11C 11/161* (2013.01); *G06N 3/04* (2013.01); *G11C 11/1653* (2013.01); *G11C 11/1673* (2013.01); *G11C 11/54* (2013.01); *H10B 61/22* (2023.02); *H10N 50/80* (2023.02)

(58) Field of Classification Search
CPC ............ G11C 11/1659; G11C 11/1673; G11C 11/1693; G11C 11/1675
See application file for complete search history.

(56) References Cited

U.S. PATENT DOCUMENTS

2019/0295617 A1* 9/2019 Wang ..................... H10N 50/10

* cited by examiner

*Primary Examiner* — Jason Lappas
(74) *Attorney, Agent, or Firm* — Benesch Friedlander Coplan & Aronoff LLP

(57) ABSTRACT

Embodiments of a Stochastic memristive array (SMA) device based on arrays of voltage-controlled magnetic tunnel junctions (MTJs) are disclosed. The SMA device is based on an array of stochastic (low energy barrier) magnetic tunnel junctions that are connected in parallel which simultaneously exhibits features that include (i) stochasticity and (ii) memristive behavior. The energy barrier of the MJTs may be tuned by an applied voltage (electric field). SMA devices may find applications in emerging computing concepts such as probabilistic computing and memcomputing, among others, providing a pathway towards intelligent hybrid CMOS-spintronic systems.

7 Claims, 8 Drawing Sheets

STOCHASTIC MEMRISTIVE DEVICES BASED ON ARRAYS OF MAGNETIC TUNNEL JUNCTIONS

CROSS-REFERENCE TO RELATED APPLICATIONS

The present application is a divisional application of U.S. patent application Ser. No. 17/406,491 entitled "Stochastic Memristive Devices Based on Arrays of Magnetic Tunnel Junctions," filed on Aug. 19, 2021, which claims the benefit of priority under 35 U.S.C. § 120 as a continuation-in-part application from U.S. patent application Ser. No. 16/919,997 entitled "Stochastic Memristive Devices Based on Arrays of Magnetic Tunnel Junctions," filed on Jul. 2, 2020, which claims the benefit of priority under 35 U.S.C. § 119 from U.S. Provisional Patent Application Ser. No. 62/870,277 entitled "Stochastic Memristive Devices Based on Arrays of Magnetic Tunnel Junctions," filed on Jul. 3, 2019, all the disclosures of which are hereby incorporated by reference in their entirety for all purposes.

BACKGROUND

Computing systems may be undergoing a transformation from a logic-centric architecture towards a memory-centric architecture. In these architectures, the speed and energy efficiency of the systems are determined by the density, performance, and energy efficiency of their memory rather than their logic.

Computational paradigms have emerged that are not based on traditional Turing and von Neumann principles. These paradigms solve some of the time and energy limitations faced by the modern computers. Many existing memory technologies are too slow, too expensive, or too complex to be used in this paradigm.

The description provided in the background section should not be assumed to be prior art merely because it is mentioned in or associated with the background section. The background section may include information that describes one or more aspects of the subject technology.

SUMMARY

According to certain aspects of the present disclosure, a device is provided. The device includes an array of a number (n) of magnetic tunnel junctions (MTJs) electrically connected in parallel configuration. Each MTJ has a voltage-tunable thermal stability corresponding to a mean switching time due to the voltage-controlled magnetic anisotropy effect. Each MTJ in the array of the number (n) of MTJs exhibits a stochastic switching of a resistance between two states of values R1 and R0. An overall resistance of the array of the number (n) of MTJs include a value between R1/n and R0/n.

According to certain aspects of the present disclosure, a device is provided. The device includes an array of a number (n) of magnetic tunnel junctions (MTJs) electrically connected in series configuration. Each MTJ has a voltage-tunable thermal stability corresponding to a mean switching time due to the voltage-controlled magnetic anisotropy effect. Each MTJ in the array of the number (n) of MTJs exhibits a stochastic switching of a resistance between two states of values R1 and R0. An overall resistance of the array of the number (n) of MTJs having a value between R1*n and R0*n.

According to certain aspects of the present disclosure, a device is provided. The device includes an array of magnetic tunnel junctions (MTJs) electrically connected in parallel configuration. Each MTJ of the array of MTJs has a voltage-tunable thermal stability. Each MTJ of the array of MTJs exhibits a stochastic switching of a resistance between two states of values R1 and R0. An overall resistance of the array of MTJs has a value between R1/n and R0/n, where n is a number of active MTJs in the array of MTJs.

According to certain aspects of the present disclosure, a device is provided. The device includes an array of magnetic tunnel junctions (MTJs) electrically connected in series configuration. Each MTJ of the array of MTJs has a voltage-tunable thermal stability. Each MTJ of the array of MTJs exhibits a stochastic switching of a resistance between two states of values R1 and R0. An overall resistance of the array of MTJs has a value between R1*n and R0*n, where n is a number of active MTJs in the array of MTJs.

According to certain aspects of the present disclosure, a device is provided. The device includes a plurality of stochastic memristive arrays. Adjacent stochastic memristive arrays are connected in series. Each stochastic memristive array of the plurality of stochastic memristive arrays includes an array of magnetic tunnel junctions (MTJs) electrically connected in parallel configuration. Each MTJ of the array of MTJs has a voltage-tunable thermal stability. Each MTJ of the array of MTJs exhibits a stochastic switching of a resistance between two states of values R1 and R0. An overall resistance of the array of MTJs has a value between R1/n and R0/n, where n is a number of active MTJs in the array of MTJs.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

WRITTEN DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

A spintronics device may include a free magnetic layer that may switch an electron spin state (e.g., spin up/spin down) under an applied magnetic field. An electron spin state switching may correspond to binary characteristics (1 or 0) of a memory, such as a binary set of electrical resistance values. Spintronics devices provide a basis for the development of such efficient devices and unconventional operations for many reasons. Such spintronics systems may have low-power requirements of spin-based devices, strong nonlinearity, time nonlocality, and/or stochasticity, and are compatible with CMOS logic. The non-volatility, high endurance and speed of spintronic devices means that they can be rewritten or reconfigured frequently over a lifetime and maintain information without requiring a source of power.

The below description discloses implementation of a spintronic device as embodiments of a Stochastic memristive array (SMA) device based on arrays of voltage-controlled magnetic tunnel junctions (MTJs). The SMA device is based on an array of stochastic (low energy barrier) magnetic tunnel junctions that are connected in parallel which simultaneously exhibits features that include (i) Stochasticity and (ii) memristive behavior. The energy barrier of the MJTs may be tuned by an applied voltage (electric field). SMA devices may find applications in emerging computing concepts such as probabilistic computing and memcomputing, among others, providing a pathway towards intelligent hybrid CMOS-spintronic systems.

Figure 1:
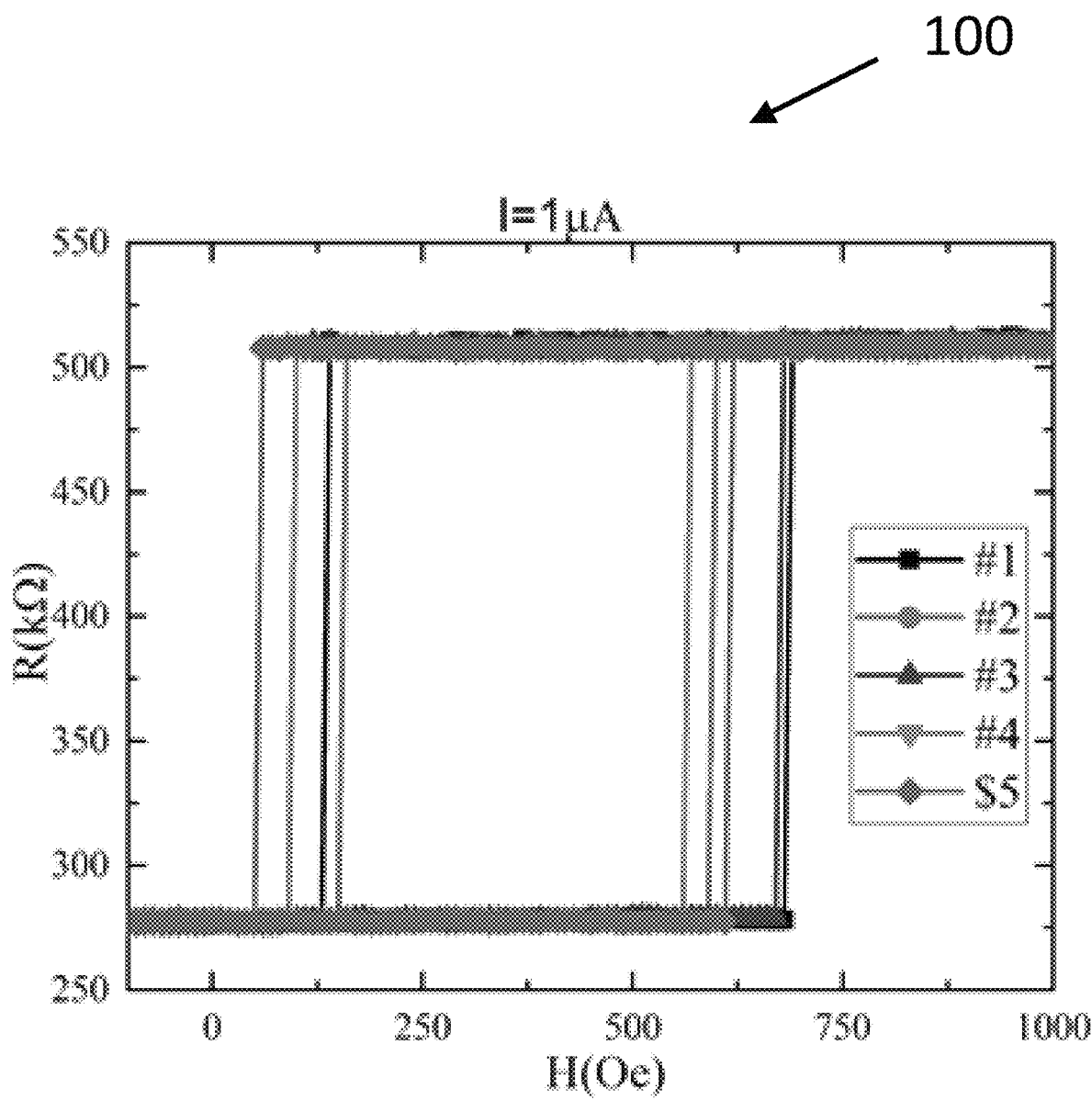
FIG. 1 is a graph illustrating five consecutive resistance versus magnetic field measurements for the same magnetic tunnel junction with a diameter of 50 nm and a sensing current of 1 µA, exhibiting stochastic behavior.

FIG. 1 illustrates graph 100, which depicts exemplary tunneling resistance characteristics of a Magnetic tunnel junction (MTJ) versus an applied magnetic field, when a common sensing current is applied. Magnetic tunnel junctions (MTJs) are devices where two magnetic layers (e.g. Fe, Co, CoFeB) are separated by a thin tunneling barrier (which usually is MgO). They exhibit different resistance states depending on the relative orientation of the magnetization in the two ferromagnetic layers, with high (low) resistance corresponding to anti-parallel (parallel) orientation.

In FIG. 1 one of the magnetic layers has a magnetization that has a fixed direction, hence is referred to as the fixed layer. The other layer may be switched between two states, and may be referred to as a free layer. The free layer's orientation may be switched in response to a magnetic field, current (via the spin-transfer torque, STT) or voltage (via the voltage-controlled magnetic anisotropy, VCMA). In slowly varying fields or currents, the switching may be thermally activated or stochastic. This may occur when the switching field is not exactly the same during repeated measurements of the resistance versus an applied magnetic field, as shown in FIG. 1. This stochastic behavior may be used, for Magnetic Tunnel Junction MTJs with a sufficiently small diameter (e.g., about 50 nm or less depending on the anisotropy and thickness of the free layer), to generate a train of voltage values proportional to the device resistance which are random in nature. Stochastic MTJ can be applied to various computing tasks such as probabilistic computing, sampling, and random number generation, among others.

Figure 2:
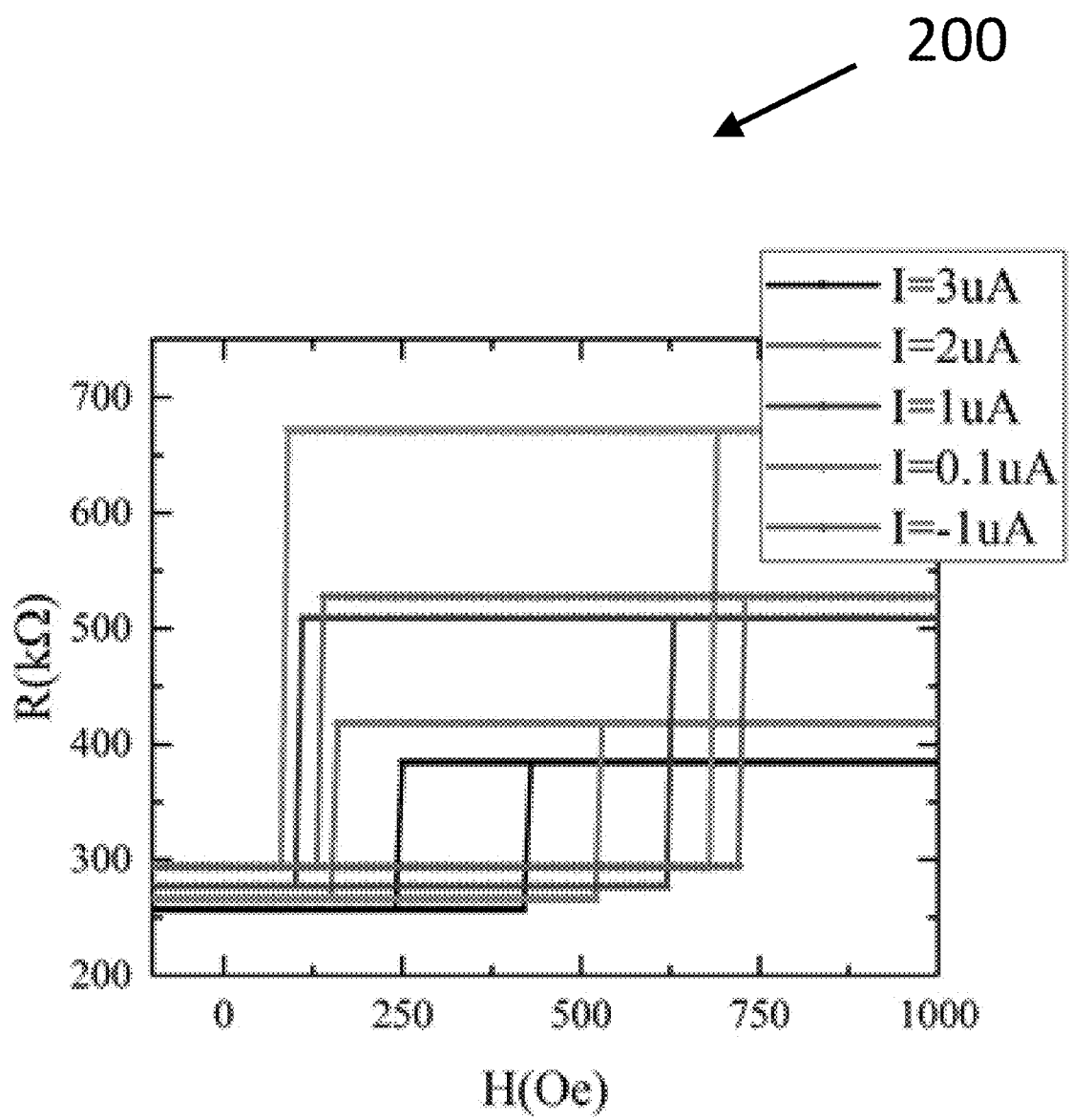
FIG. 2 is a graph illustrating five resistance versus magnetic field measurements for the same magnetic tunnel junction with a diameter of 50 nm, using five different sensing currents (i.e. voltages across the junction), and illustrating the voltage-controlled magnetic anisotropy effect.

FIG. 2 illustrates graph 200, which depicts corresponding tunneling resistance characteristics versus an applied magnetic field, when a different sensing current is applied to a magnetic tunnel junction. FIG. 2 illustrates that the stability or mean switching time of each MTJ may be controlled by a voltage, via the VCMA effect. This can be executed by applying a common voltage bias to all of the MTJs in the SMA in a directly parallel connected SMA version, for example, or in individually tailored biases, in the transistor-connected version, for example. The stochasticity of the SMA may be tuned and turned on/off by a voltage range depending on the stage of the computation as controlled by an algorithm. FIG. 2 shows the control of the magnetic coercivity of an MTJ by applied voltage (or equivalently, current) via the VCMA.

Figure 3:
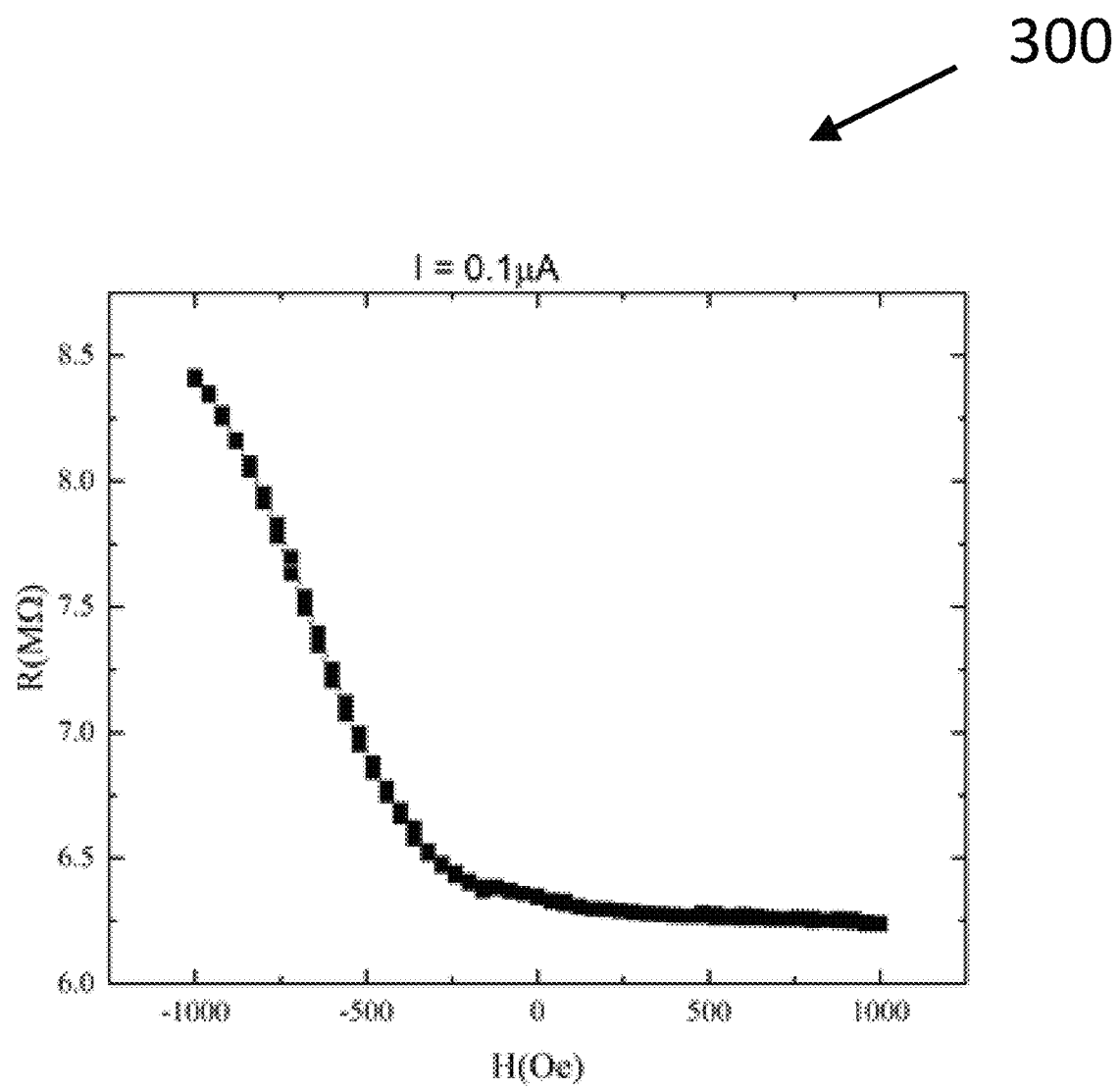
FIG. 3 is a graph illustrating resistance versus magnetic field measurement for an array of magnetic tunnel junctions (with a diameter of 50 nm) connected in parallel, exhibiting analog memristive behavior.

FIG. 3 illustrates graph 300, which depicts memristive characteristics of an array of MTJs versus an applied magnetic field when a same sensing current is applied. The magnetic tunnel junction array may exhibit memristive resistance characteristics which remembers its most recent resistance even after a power source is removed and changes in a continuous fashion with respect to the input. Memristive resistance is dependent on the most recent history of applied current or magnetic field.

Figure 4A:
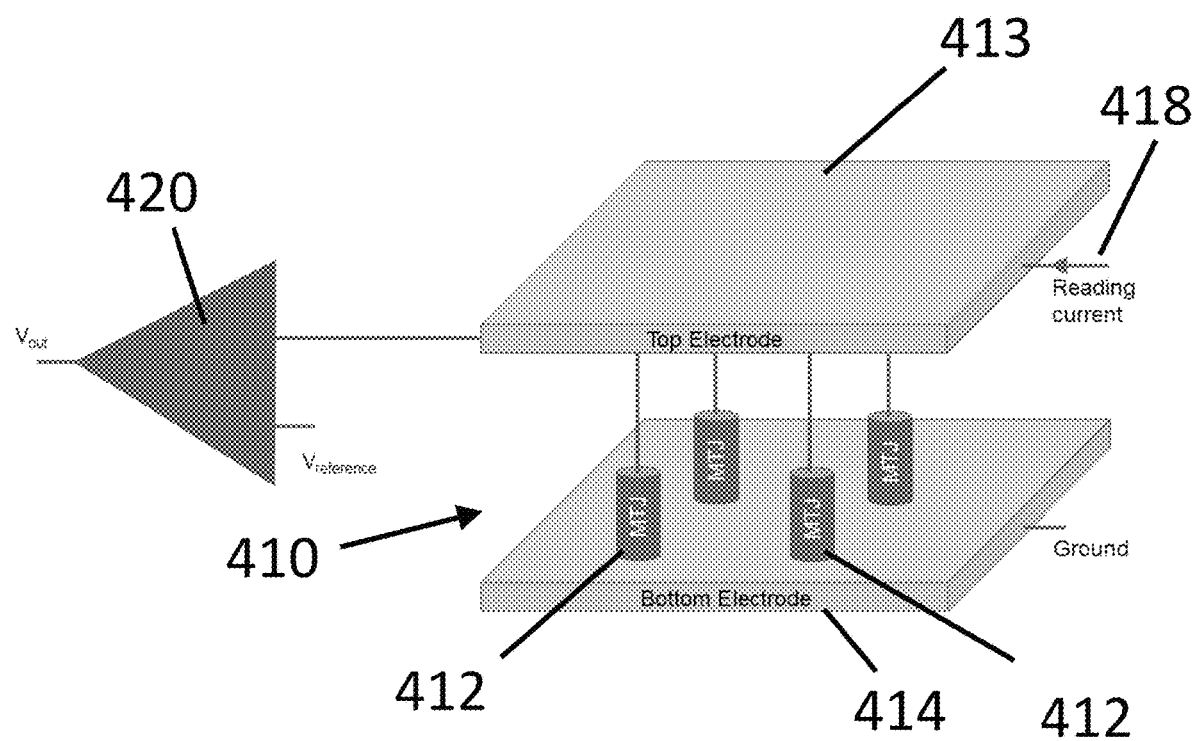
FIG. 4A is a schematic diagram illustrating an array of magnetic tunnel junctions, according to certain aspects of the disclosure.
Figure 4B:
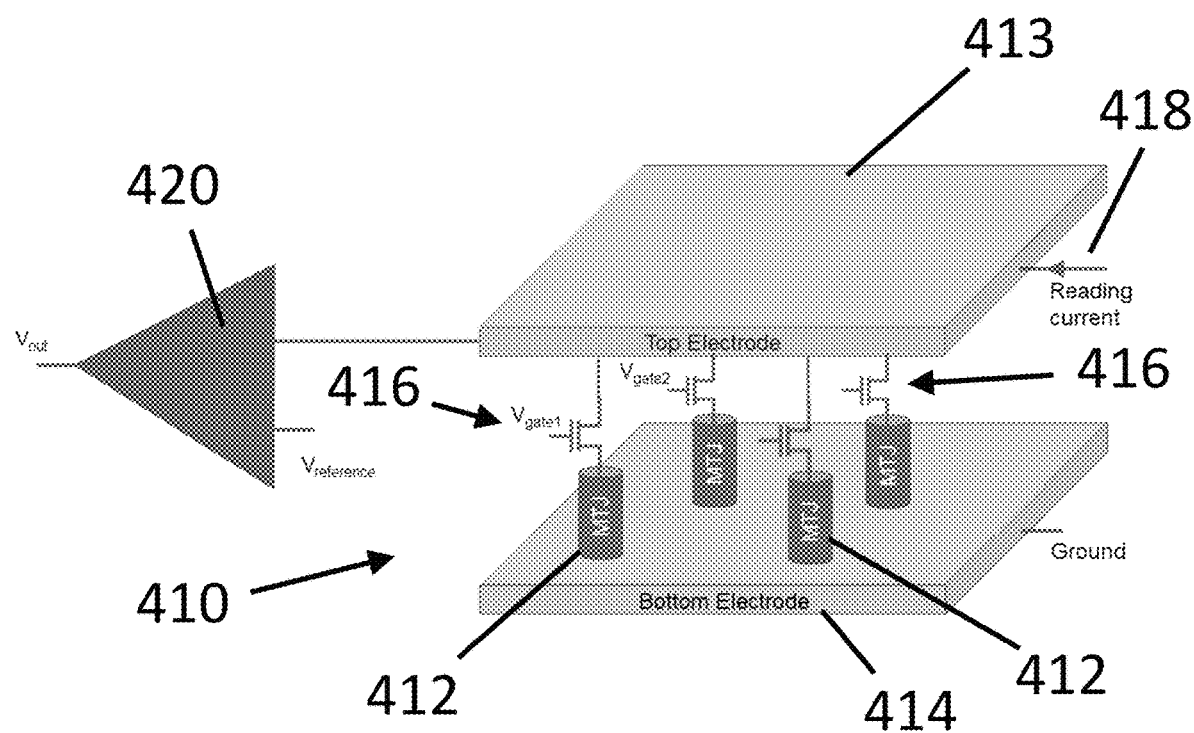
FIG. 4B is a schematic diagram illustrating an alternative array of magnetic tunnel junctions, according to certain aspects of the disclosure.

With reference to FIGS. 4A and 4B, the disclosed system describes an implementation of memristive resistance on Magnetic tunnel junctions (MTJs) as a stochastic memristive array (SMA) 410. The SMA 410 may include a plurality of MTJs 412 (no less than two, but typically more than four), which may be arranged in an array and may be connected in parallel, as exemplarily illustrated in FIG. 4A. One side of each of the MTJs 412 may be connected to common top electrodes 413 and the other side of each of the MTJs may be connected to common bottom electrodes 414, such as when the array of MTJs are directly connected in parallel. Alternatively, as exemplarily illustrated in FIG. 4B, each MTJ of the plurality of MTJs 412 may be connected in series with a select device 416, such as a transistor, for example, so that only the MTJs where the corresponding transistor is turned on, are in connected in parallel. In this layout the number of MTJs in the SMA can be controlled by the gate voltages of the transistors. The collective resistance of the parallel MTJs is read out in response to a small applied current (reading current) 418, which may typically take values between about 1 to about 100 micro-Amperes. The voltage generated by this current is read by a sensing amplifier 420 and compared to a series of reference voltages (generated, for example, by passing a current through a series of reference resistors), to determine the overall SMA resistance. Alternatively, the SMA may be used directly as a node in a circuit. In this use case, the SMA's resistance fulfills a function where a variable stochastic resistance value may be beneficial, such as weights in a neural network.

The operation of the SMA may be illustrated as follows. The resistance of each MTJ may stochastically switch between two values, R0=R high and R1=R low, corresponding to conductances G0=1/R0 and G1=1/R1. R0 and R1 may have different values such that their ratio falls with ~2-4 range or (R0-R1)/R1=100-300%. This may be referred to as the TMR ratio. The conductance of the entire array is expressed as G=1/R=Sum(G(MTJ1 . . . MTJn)), which forms a sum of the conductances of all MTJs in the array. Here, G and R may represent the total conductance and resistance of the SMA, respectively, and n is the number of (active) MTJs in the SMA. Since the resistance of each MTJ switches stochastically, the array may exhibit a resistance between R0/n and R1/n, and may take any value within this range, in intervals equaling the number of MTJs, n. The result is a nearly continuously varying (analog) resistance versus field (or generally, output-input) relationship, resembling the function of a memristor. An example of a measured curve of the memristor may be shown in FIG. 3.

Figure 4C:
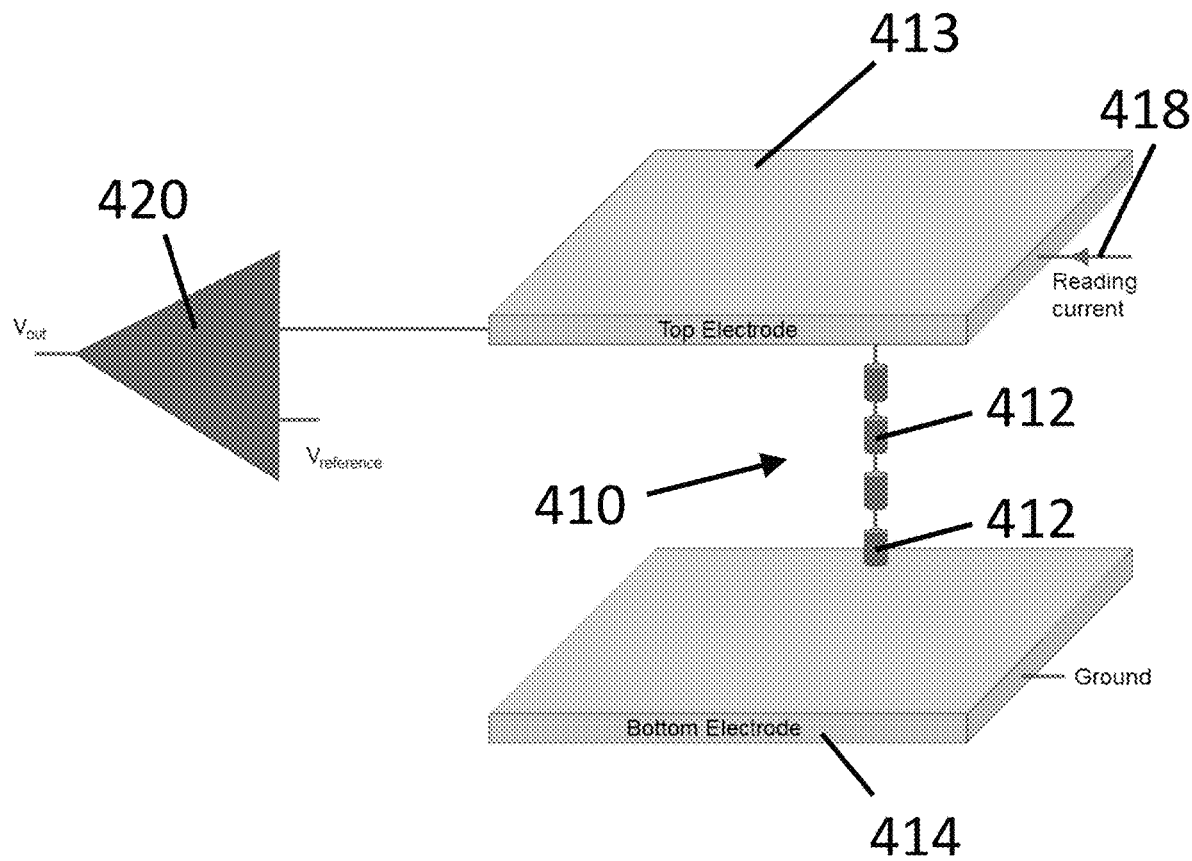
FIG. 4C is a schematic diagram illustrating another alternative array of magnetic tunnel junctions with each magnetic tunnel junction connected in series, according to certain aspects of the disclosure.

In certain aspects, as illustrated in FIG. 4C, the SMA 410 may include a plurality of MTJs 412 (no less than two, but typically more than four), which may be arranged in an array and may be connected in series. In such a configuration, since the resistance of each MTJ switches stochastically, the SMA 410 may exhibit a resistance between R0*n and R1*n, and may take any value within this range, where n is the number of active MTJs in the SMA 410.

Figure 5A:
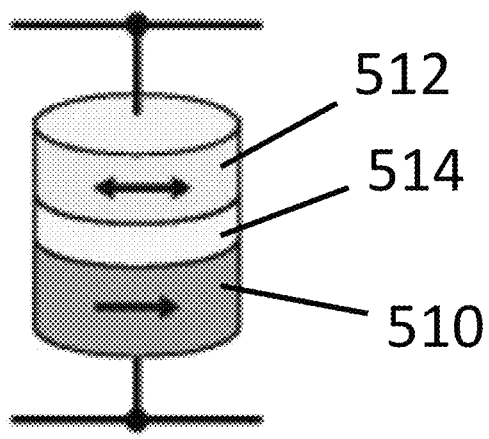
FIG. 5A is a schematic diagram illustrating a magnetic tunnel junction with an in-plane magnetization configuration, according to certain aspects of the disclosure.
Figure 5B:
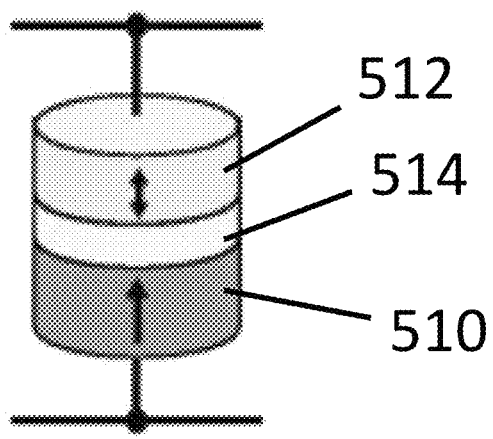
FIG. 5B is a schematic diagram illustrating a magnetic tunnel junction with an out-of-plane (perpendicular) magnetization configuration, according to certain aspects of the disclosure.

As discussed above and with reference to FIG. 5A, each MTJ includes a fixed layer 510 and a free layer 512 separated by a thin tunneling barrier 514. In certain aspects, each of the MTJs of the plurality of MTJs 412 in a stochastic memristive array, such as the SMA 410, for example, includes an in-plane magnetization configuration in both the fixed layer 510 and the free layer 512, as exemplarily illustrated in FIG. 5A. In certain other aspects, each of the MTJs of the plurality of MTJs 412 in a stochastic memristive array, such as the SMA 410, for example, includes an out-of-plane magnetization configuration in both the fixed layer 510 and the free layer 512, as exemplarily illustrated in FIG. 5B. In certain other aspects, the plurality of MTJs 412 in a stochastic memristive array, such as the SMA 410, for example, includes a combination of MTJs with in-plane and out-of-plane magnetization configurations.

Figure 6:
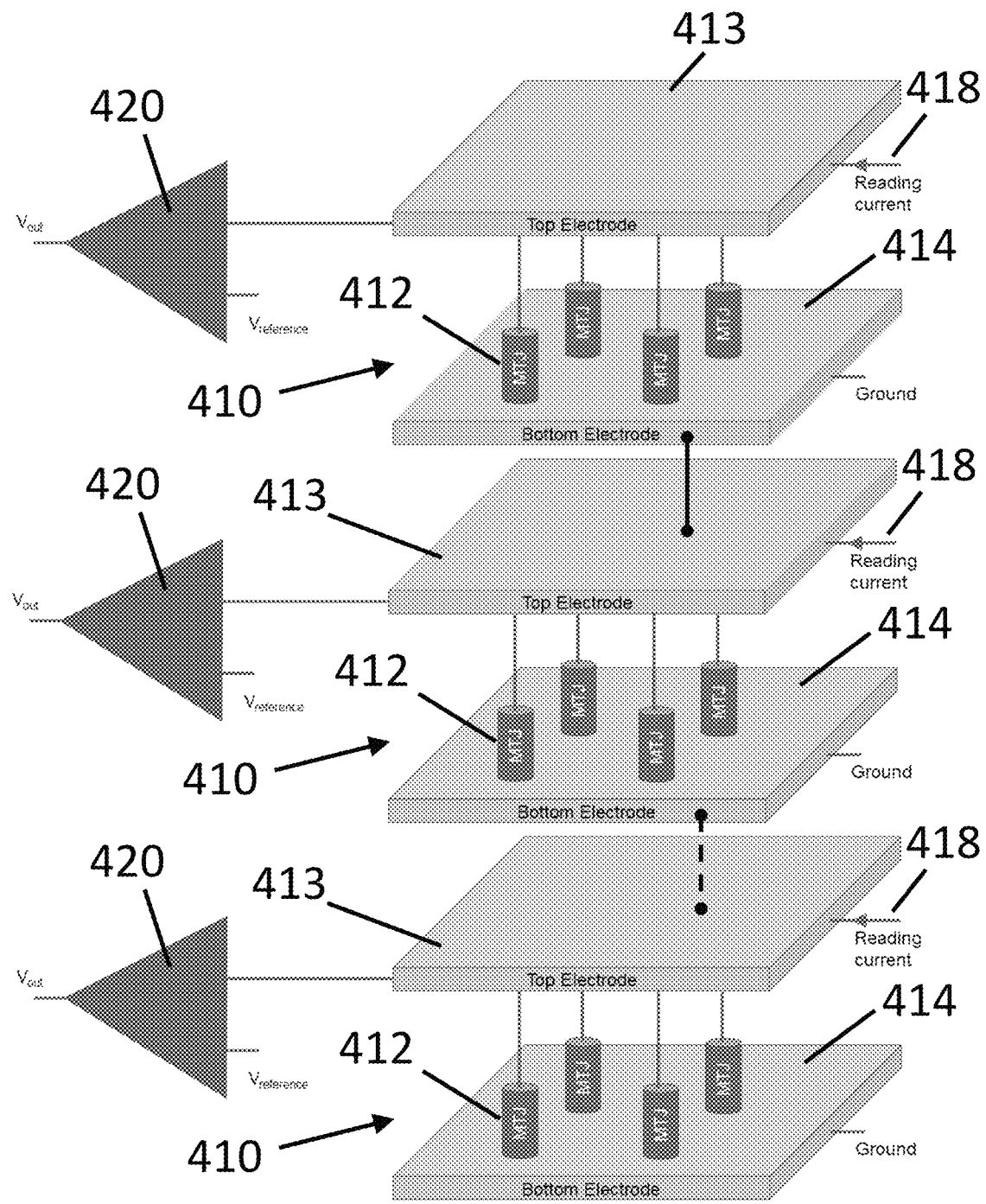
FIG. 6 is a schematic diagram illustrating a plurality of stochastic memristive arrays connected in series, according to certain aspects of the disclosure.

In certain aspects, as illustrated in FIG. 6, the disclosed technology can be configured such that a plurality of stochastic memristive arrays, such as the SMA 410 of FIG. 4A, are connected in series forming a plurality of SMAs 610. In such an arrangement, it should be understood that the plurality of MTJs 412 within each SMA of the plurality of SMAs 610 are connected in parallel. The plurality of SMAs 610 can include any number of SMAs.

Some use cases may combine both of the features of stochasticity and memristive behavior. Devices with single magnetic tunnel junctions may exhibit a low energy barrier, with potential applications in random number generation, sampling, and probabilistic computing. For memristive behavior, a variety of oxide based systems may be used with the prototypical system being metal/oxide/metal junctions, where the conductivity of the oxide layer changes as a function of currents applied through the (non-magnetic metals). This disclosure describes combining true stochastic behavior with analog memristive characteristics in the same structure, which may provide a platform for realization of unconventional computing paradigms, such as probabilistic computing and memcomputing.

While various embodiments have been described, it is apparent that more embodiments and implementations are possible. Accordingly, the embodiments are not to be restricted.

What is claimed is:

1. A device comprising:
an array of magnetic tunnel junctions (MTJs) electrically connected in series configuration,
wherein each MTJ of the array of MTJs has a voltage-tunable thermal stability,
wherein each MTJ of the array of MTJs exhibits a stochastic switching of a resistance between two states of values R1 and R0, and
wherein an overall resistance of the array of MTJs having a value between R1*n and R0*n, where n is a number of active MTJs in the array of MTJs.

2. The device of claim 1, wherein each MTJ of the array of MTJs comprises a fixed layer and a free layer, wherein the fixed layer and the free layer of each MTJ comprises an in-plane magnetization configuration.

3. The device of claim 1, wherein each MTJ of the array of MTJs comprises a fixed layer and a free layer, wherein the fixed layer and the free layer of each MTJ comprises an out-of-plane magnetization configuration.

4. The device of claim 1, wherein the array of MTJs comprises at least one MTJ with an in-plan magnetization configuration and at least one MTJ with an out-of-plane magnetization configuration.

5. The device of claim 1, wherein the array of MTJs is operated as a memristive element.

6. The device of claim 1, wherein a plurality of the devices are connected to form an artificial neural network, where a weight of each connection is controlled by the array of MTJs.

7. The device of claim 1, wherein the array of MTJs is coupled to a sensing amplifier.

* * * * *